United States Patent
Straaijer

(10) Patent No.: US 8,797,554 B2
(45) Date of Patent: Aug. 5, 2014

(54) DETERMINING A STRUCTURAL PARAMETER AND CORRECTING AN ASYMMETRY PROPERTY

(71) Applicant: Alexander Straaijer, Eindhoven (NL)

(72) Inventor: Alexander Straaijer, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 13/891,410

(22) Filed: May 10, 2013

(65) Prior Publication Data

US 2013/0308142 A1 Nov. 21, 2013

Related U.S. Application Data

(60) Provisional application No. 61/649,891, filed on May 21, 2012.

(51) Int. Cl.
*G01B 11/28* (2006.01)
*G01B 11/24* (2006.01)
*G01B 11/02* (2006.01)
*G03F 7/20* (2006.01)

(52) U.S. Cl.
CPC ............... *G01B 11/24* (2013.01); *G01B 11/02* (2013.01); *G03F 7/70633* (2013.01); *G03F 7/70616* (2013.01)
USPC .......................................... 356/625; 356/626

(58) Field of Classification Search
CPC ............ G03F 7/70633; G03F 7/70616; G06T 2207/30148; G06T 7/0004; G01N 21/4788; G01N 21/55; G01N 21/956; G01B 11/24; G01B 11/00; H01L 22/34; H01L 22/12
See application file for complete search history.

(56) References Cited

U.S. PATENT DOCUMENTS

| | | | | |
|---|---|---|---|---|
| 5,982,489 | A * | 11/1999 | Shiraishi | 356/504 |
| 7,236,244 | B1 | 6/2007 | Yang et al. | |
| 7,791,740 | B2 * | 9/2010 | Finarov et al. | 356/625 |
| 7,839,506 | B2 * | 11/2010 | Straaijer et al. | 356/369 |
| 8,023,122 | B2 * | 9/2011 | Finarov et al. | 356/601 |
| 8,531,678 | B2 * | 9/2013 | Finarov et al. | 356/614 |

(Continued)

FOREIGN PATENT DOCUMENTS

WO 2009/078708 6/2009
WO 2009/106279 9/2009

*Primary Examiner* — Michael P Stafira
(74) *Attorney, Agent, or Firm* — Pillsbury Winthrop Shaw Pittman LLP

(57) ABSTRACT

A method of determining a structural parameter related to process-induced asymmetry, the method including: illuminating a structure, having an asymmetry property and a sub-structure susceptible to process-induced asymmetry, with radiation with a plurality of illumination conditions, at a first location of a substrate, determining a difference between measured asymmetry properties of the structure obtained with each of the plurality of illumination conditions, calculating a differential dependence of a difference between modeled asymmetry properties simulated for illumination by each of the plurality of illumination conditions on a structural parameter representing process-induced asymmetry of the sub-structure, and determining a value of the structural parameter using the determined difference and the calculated differential dependence.

23 Claims, 10 Drawing Sheets

(56) References Cited

U.S. PATENT DOCUMENTS

| | | |
|---|---|---|
| 2009/0153825 A1* | 6/2009 | Edart et al. ............. 355/67 |
| 2010/0201963 A1 | 8/2010 | Cramer et al. |
| 2011/0027704 A1 | 2/2011 | Cramer et al. |
| 2011/0043791 A1 | 2/2011 | Smilde et al. |
| 2012/0013881 A1 | 1/2012 | Den Boef et al. |
| 2012/0033193 A1 | 2/2012 | Van Der Schaar et al. |
| 2012/0113404 A1 | 5/2012 | Hsu et al. |
| 2012/0123581 A1 | 5/2012 | Smilde et al. |
| 2012/0212718 A1* | 8/2012 | Den Boef ............. 355/67 |
| 2013/0054186 A1 | 2/2013 | Den Boef |
| 2013/0162996 A1* | 6/2013 | Straaijer et al. ............. 356/369 |

\* cited by examiner

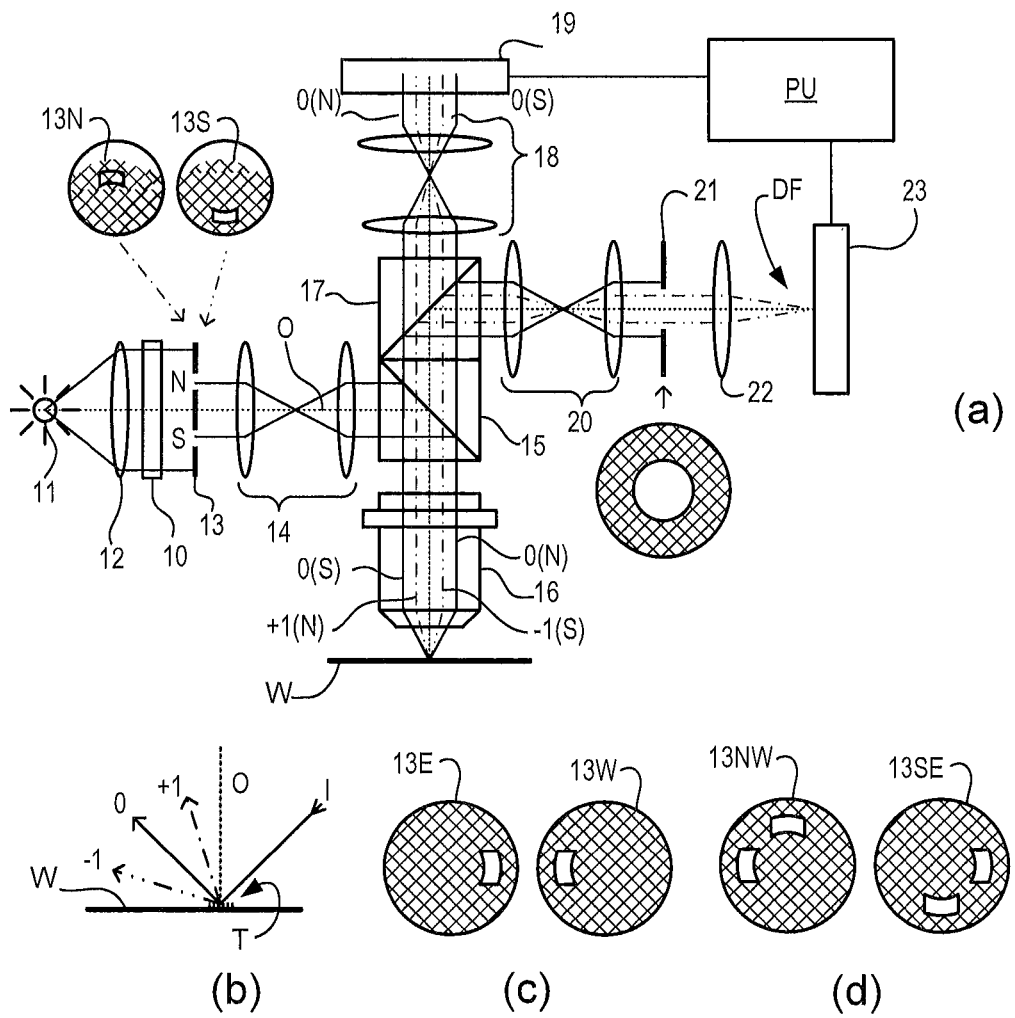
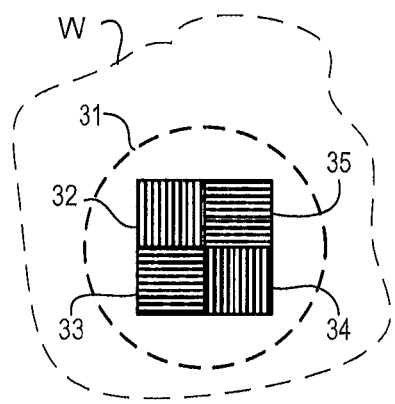
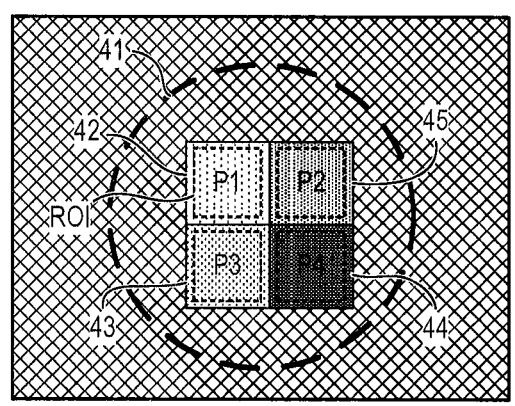
Fig. 3
Fig. 4            Fig. 5

DETERMINING A STRUCTURAL PARAMETER AND CORRECTING AN ASYMMETRY PROPERTY

This application claims the benefit of U.S. provisional patent application 61/649,891, filed on May 21, 2012, which is incorporated herein in its entirety by reference.

FIELD

The present description relates to methods and apparatus to determine structural parameters related to process-induced asymmetry, such as overlay target bottom-layer floor tilt, and correcting measured asymmetry properties, such as overlay, for process-induced asymmetry usable, for example, in the manufacture of devices by lithographic techniques and to methods of manufacturing devices using lithographic techniques.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., including part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti parallel to this direction. It is also possible to transfer the pattern from the patterning device to the substrate by imprinting the pattern onto the substrate.

In lithographic processes, it is desirable to frequently make measurements of the structures created, e.g., for process control and verification. Various tools for making such measurements are known, including scanning electron microscopes, which are often used to measure critical dimension (CD), and specialized tools to measure overlay, the accuracy of alignment of two layers in a device. Recently, various forms of scatterometers have been developed for use in the lithographic field. These devices direct a beam of radiation onto a target and measure one or more properties of the scattered radiation—e.g., intensity at a single angle of reflection as a function of wavelength; intensity at one or more wavelengths as a function of reflected angle; or polarization as a function of reflected angle—to obtain a "spectrum" from which a property of interest of the target can be determined. Determination of the property of interest may be performed by various techniques: e.g., reconstruction of the target structure by iterative approaches such as rigorous coupled wave analysis or finite element methods, library searches, and principal component analysis.

The targets used by conventional scatterometers are relatively large, e.g., 40 μm by 40 μm, gratings and the measurement beam generates a spot that is smaller than the grating (i.e., the grating is underfilled). This simplifies mathematical reconstruction of the target as it can be regarded as infinite. However, in order to reduce the size of the targets, e.g., to 10 μm by 10 μm or less, e.g., so they can be positioned in amongst product features, rather than in the scribe lane, metrology has been proposed in which the grating is made smaller than the measurement spot (i.e., the grating is overfilled). Typically such targets are measured using dark field scatterometry in which the zeroth order of diffraction (corresponding to a specular reflection) is blocked, and only higher orders processed. Examples of dark field metrology can be found in International Patent Application Publication Nos. WO 2009/078708 and WO 2009/106279 which documents are hereby incorporated by reference in their entirety. Further developments of the technique have been described in U.S. Patent Application Publication Nos. 2011/0027704, 2011/0043791 and US 2012-0113404. The contents of all these applications are also incorporated herein by reference. Diffraction-based overlay using dark-field detection of the diffraction orders enables overlay measurements on smaller targets. These targets can be smaller than the illumination spot and may be surrounded by product structures on a wafer. Multiple targets can be measured in one image.

In the known metrology technique, overlay measurement results are obtained by measuring the target twice under certain conditions, while either rotating the target or changing the illumination mode or imaging mode to obtain separately the $-1^{st}$ and the $+1^{st}$ diffraction order intensities. Comparing these intensities for a given grating provides a measurement of asymmetry in the grating, and asymmetry in an overlay grating can be used as an indicator of overlay error.

SUMMARY

Although the known dark-field image-based overlay measurements are fast and computationally very simple (once calibrated), they rely on an assumption that overlay is the only cause of asymmetry in the target structure. Any other asymmetry in the stack, such as asymmetry of features within one or both of the overlaid gratings, also causes an asymmetry in the $1^{st}$ orders. This asymmetry, which is not related to the overlay, clearly perturbs the overlay measurement, giving an inaccurate overlay result. Asymmetry in the bottom grating of the overlay target is a common form of feature asymmetry. It may originate for example in wafer processing steps such as chemical-mechanical polishing (CMP), performed after the bottom grating was originally formed.

Accordingly at this time, the skilled person has to choose between, on the one hand, a simple and fast measurement process that gives overlay measurements but is subject to inaccuracies when other causes of asymmetry are present, and on the other hand more traditional techniques that are computationally intensive and typically use several measurements of large, underfilled gratings to avoid the pupil image being polluted with signal from the environment of the overlay grating, which hampers the reconstruction on this.

Therefore, in the cases of both overlay measurements with pupil plane detection and underfilled targets, and overlay measurements with dark-field detection and smaller overfilled targets, it is difficult to determine structural parameters related to process-induced asymmetry and correct measurements of overlay for process-induced asymmetry in the overlay target structure.

It is desirable, for example, to provide methods and apparatus for overlay metrology using target structures that determine structural parameters related to process-induced asymmetry and corrects measurements of overlay for process-induced asymmetry in the overlay target structure, in a simple and high-throughput way. Furthermore, although not limited to this, it would be of advantage if the methods and apparatus could be applied to small target structures that can be read out with the dark-field image-based technique.

In an aspect, there is provided a method of determining a structural parameter related to process-induced asymmetry, the method comprising:

illuminating a structure, having an asymmetry property and comprising a sub-structure susceptible to process-induced asymmetry, with radiation with a plurality of illumination conditions, at a first location of a substrate;

determining a difference between measured asymmetry properties of the structure obtained with each of the plurality of illumination conditions;

calculating a differential dependence of a difference between modeled asymmetry properties simulated for illumination by each of the plurality of illumination conditions on a structural parameter representing process-induced asymmetry of the sub-structure; and determining a value of the structural parameter using the determined difference and the calculated differential dependence.

In an aspect, there is provided a method of correcting a measured asymmetry property for process-induced asymmetry, the method comprising determining a structural parameter related to process-induced asymmetry as described herein, and further comprising:

calculating a dependence of a modeled single-illumination-condition asymmetry property, simulated for illumination by a single illumination condition, on the structural parameter; and using the determined structural parameter at the first location on the substrate and the calculated dependence of the modeled single-illumination-condition asymmetry property to correct a measured single-illumination-condition asymmetry property for process-induced asymmetry.

In an aspect, there is provided an inspection apparatus to determine a structural parameter related to process-induced asymmetry, the inspection apparatus comprising:

an illumination system configured to illuminate a structure, the structure having an asymmetry property and comprising a sub-structure susceptible to process-induced asymmetry, with radiation with a plurality of illumination conditions, at a first location of a substrate; and a processor configured to: determine a difference between measured asymmetry properties of the structure obtained with each of the plurality of illumination conditions; calculate a differential dependence of a difference between modeled asymmetry properties simulated for illumination by each of the plurality of illumination conditions on a structural parameter representing process-induced asymmetry of the sub-structure; and determine a value of the structural parameter using the determined difference and the calculated differential dependence.

In an aspect, there is provided an apparatus to correct a measured asymmetry property for process-induced asymmetry, comprising the inspection apparatus as described herein, wherein the processor is further configured to: calculate a dependence of a modeled single-illumination-condition asymmetry property, simulated for illumination by a single illumination condition, on the structural parameter; and use the determined structural parameter at the first location on the substrate and the calculated dependence of the modeled single-illumination-condition asymmetry property to correct a measured single-illumination-condition asymmetry property for process-induced asymmetry.

In an aspect, there is provided a lithographic apparatus comprising: an illumination system arranged to illuminate a pattern; a projection system arranged to project an image of the pattern on to a substrate; and an inspection apparatus to determine a structural parameter related to process-induced asymmetry, the inspection apparatus comprising: an illumination system configured to illuminate a structure, having an asymmetry property and comprising a sub-structure susceptible to process-induced asymmetry, with radiation with a plurality of illumination conditions, at a first location of a substrate; and a processor configured to: determine a difference between measured asymmetry properties of the structure obtained with each of the plurality of illumination conditions; calculate a differential dependence of a difference between modeled asymmetry properties simulated for illumination by each of the plurality of illumination conditions on a structural parameter representing process-induced asymmetry of the sub-structure; and determine a value of the structural parameter using the determined difference and the calculated differential dependence.

In an aspect, there is provided a lithographic cell comprising: a coater arranged to coat a substrate with a radiation sensitive layer; a lithographic apparatus arranged to expose an image onto the radiation sensitive layer of substrate coated by the coater; a developer arranged to develop the image exposed by the lithographic apparatus; and an inspection apparatus to determine a structural parameter related to process-induced asymmetry, the inspection apparatus comprising: an illumination system configured to illuminate a structure, having an asymmetry property and comprising a sub-structure susceptible to process-induced asymmetry, with radiation with a plurality of illumination conditions, at a first location of a substrate; and a processor configured to: determine a difference between measured asymmetry properties of the structure obtained with each of the plurality of illumination conditions; calculate a differential dependence of a difference between modeled asymmetry properties simulated for illumination by each of the plurality of illumination conditions on a structural parameter representing process-induced asymmetry of the sub-structure; and determine a value of the structural parameter using the determined difference and the calculated differential dependence.

In an aspect, there is provided a device manufacturing method comprising: using a lithographic apparatus to form a pattern on a substrate; and determining an asymmetry property of the pattern by:

illuminating a structure, having an asymmetry property and comprising a sub-structure susceptible to process-induced asymmetry, with radiation with a plurality of illumination conditions, at a first location of a substrate;

determining a difference between measured asymmetry properties of the structure obtained with each of the plurality of illumination conditions;

calculating a differential dependence of a difference between modeled asymmetry properties simulated for illumination by each of the plurality of illumination conditions on a structural parameter representing process-induced asymmetry of the sub-structure;

determining a value of the structural parameter using the determined difference and the calculated differential dependence;

calculating a dependence of a modeled single-illumination-condition asymmetry property, simulated for illumination by a single illumination condition, on the structural parameter; and using the determined structural parameter at the first location on the substrate and the calculated dependence of the modeled single-illumination-condition asymmetry property to correct a measured single-illumination-condition asymmetry property for process-induced asymmetry.

BRIEF DESCRIPTION OF THE DRAWINGS

Embodiments of the invention will now be described, by way of example only, with reference to the accompanying drawings in which:

FIG. 3 comprises (a) a schematic diagram of a dark field scatterometer for use in measuring targets according to embodiments of the invention using a first pair of illumination apertures, (b) a detail of diffraction spectrum of a target grating for a given direction of illumination, (c) a second pair of illumination apertures providing further illumination modes in using the scatterometer for diffraction based overlay measurements, and (d) a third pair of illumination apertures combining the first and second pair of apertures;

FIG. 4 depicts a known form of multiple grating target and an outline of a measurement spot on a substrate;

FIG. 5 depicts an image of the target of FIG. 4 obtained in the scatterometer of FIG. 3;

DETAILED DESCRIPTION

Before describing embodiments of the invention in detail, it is instructive to present an example environment in which embodiments of the present invention may be implemented.

Figure 1:
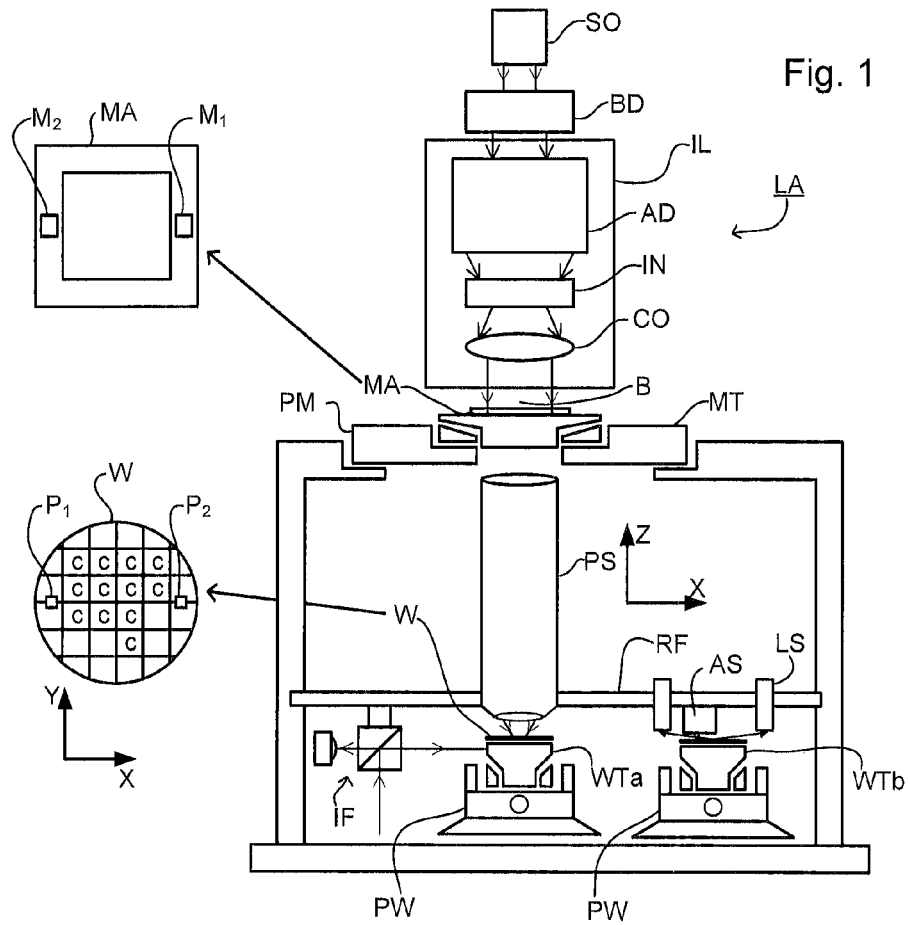
FIG. 1 depicts a lithographic apparatus according to an embodiment of the invention.

FIG. 1 schematically depicts a lithographic apparatus LA. The apparatus includes an illumination system (illuminator) IL configured to condition a radiation beam B (e.g., UV radiation or DUV radiation), a patterning device support or support structure (e.g., a mask table) MT constructed to support a patterning device (e.g., a mask) MA and connected to a first positioner PM configured to accurately position the patterning device in accordance with certain parameters; a substrate table (e.g., a wafer table) WTa constructed to hold a substrate (e.g., a resist coated wafer) W and connected to a second positioner PW configured to accurately position the substrate in accordance with certain parameters; and a projection system (e.g., a refractive projection lens system) PS configured to project a pattern imparted to the radiation beam B by patterning device MA onto a target portion C (e.g., including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The patterning device support holds the patterning device in a manner that depends on the orientation of the patterning device, the design of the lithographic apparatus, and other conditions, such as for example whether or not the patterning device is held in a vacuum environment. The patterning device support can use mechanical, vacuum, electrostatic or other clamping techniques to hold the patterning device. The patterning device support may be a frame or a table, for example, which may be fixed or movable as required. The patterning device support may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam, which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g., employing a transmissive mask). Alternatively, the apparatus may be of a reflective type (e.g., employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander, In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD for adjusting the angular intensity distribution of the radiation beam. Generally, at least the outer and/or inner radial extent (commonly referred to as o-outer and a-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross section.

The radiation beam B is incident on the patterning device (e.g., mask) MA, which is held on the patterning device support (e.g., mask table MT), and is patterned by the patterning device. Having traversed the patterning device (e.g., mask) MA, the radiation beam B passes through the projection system PS, which focuses the beam onto a target portion C of the substrate W. With the aid of the second positioner PW and position sensor IF (e.g., an interferometric device, linear encoder, 2-D encoder or capacitive sensor), the substrate table WTa can be moved accurately, e.g., so as to position different target portions C in the path of the radiation beam B. Similarly, the first positioner PM and another position sensor (which is not explicitly depicted in FIG. 1) can be used to accurately position the patterning device (e.g., mask) MA with respect to the path of the radiation beam B, e.g., after mechanical retrieval from a mask library, or during a scan. In general, movement of the patterning device support (e.g., mask table) MT may be realized with the aid of a long-stroke module (coarse positioning) and a short-stroke module (fine positioning), which form part of the first positioner PM. Similarly, movement of the substrate table WTa may be realized using a long-stroke module and a short-stroke module, which form part of the second positioner PW. In the case of a stepper (as opposed to a scanner) the patterning device support (e.g., mask table) MT may be connected to a short-stroke actuator only, or may be fixed.

Patterning device (e.g., mask) MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g., mask) MA, the mask alignment marks may be located between the dies. Small alignment markers may also be included within dies, in amongst the device features, in which case it is desirable that the markers be as small as possible and not require any different imaging or process conditions than adjacent features. The alignment system, which detects the alignment markers is described further below.

The depicted apparatus could be used in at least one of the following modes:

1. In step mode, the patterning device support (e.g., mask table) MT and the substrate table WTa are kept essentially stationary, while an entire pattern imparted to the radiation beam is projected onto a target portion C at one time (i.e., a single static exposure). The substrate table WTa is then shifted in the X and/or Y direction so that a different target portion C can be exposed. In step mode, the maximum size of the exposure field limits the size of the target portion C imaged in a single static exposure.

2. In scan mode, the patterning device support (e.g., mask table) MT and the substrate table WTa are scanned synchronously while a pattern imparted to the radiation beam is projected onto a target portion C (i.e., a single dynamic exposure). The velocity and direction of the substrate table WTa relative to the patterning device support (e.g., mask table) MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the patterning device support (e.g., mask table) MT is kept essentially stationary holding a programmable patterning device, and the substrate table WTa is moved or scanned while a pattern imparted to the radiation beam is projected onto a target portion C. In this mode, generally a pulsed radiation source is employed and the programmable patterning device is updated as required after each movement of the substrate table WTa or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Lithographic apparatus LA is of a so-called dual stage type which has two substrate tables WTa, WTb and two stations—an exposure station and a measurement station—between which the substrate tables can be exchanged. While one substrate on one substrate table is being exposed at the exposure station, another substrate can be loaded onto the other substrate table at the measurement station and various preparatory steps carried out. The preparatory steps may include mapping the surface control of the substrate using a level sensor LS and measuring the position of alignment markers on the substrate using an alignment sensor AS, both sensors being supported by a reference frame RF. This enables a substantial increase in the throughput of the apparatus. If the position sensor IF is not capable of measuring the position of the substrate table while it is at the measurement station as well as at the exposure station, a second position sensor may be provided to enable the positions of the substrate table to be tracked at both stations.

Figure 2:
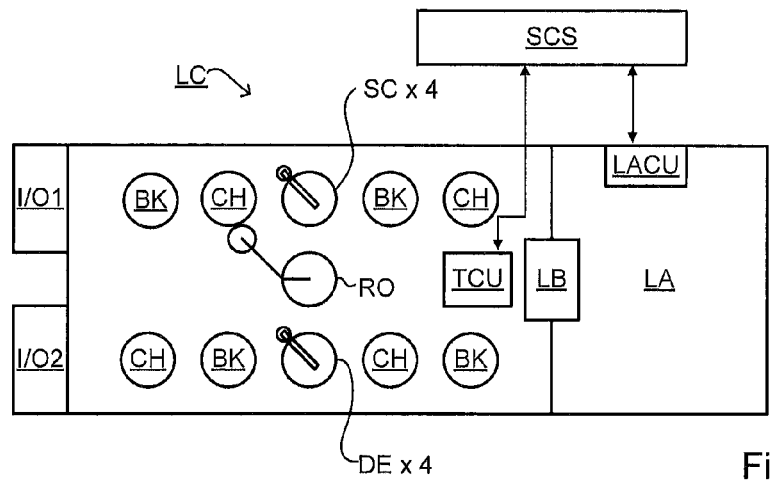
FIG. 2 depicts a lithographic cell or cluster according to an embodiment of the invention.

As shown in FIG. 2, the lithographic apparatus LA forms part of a lithographic cell LC, also sometimes referred to a lithocell or cluster, which also includes apparatus to perform pre- and post-exposure processes on a substrate. Conventionally, these include spin coaters SC to deposit resist layers, developers DE to develop exposed resist, chill plates CH and bake plates BK. A substrate handler, or robot, RO picks up substrates from input/output ports I/O1, I/O2, moves them between the different process apparatus and delivers then to the loading bay LB of the lithographic apparatus. These devices, which are often collectively referred to as the track, are under the control of a track control unit TCU which is itself controlled by the supervisory control system SCS, which also controls the lithographic apparatus via lithography control unit LACU. Thus, the different apparatus can be operated to maximize throughput and processing efficiency.

A dark field metrology apparatus suitable for use in embodiments of the invention is shown in FIG. 3(a). A target grating T and diffracted rays are illustrated in more detail in FIG. 3(b). The dark field metrology apparatus may be a stand-alone device or incorporated in either the lithographic apparatus LA, e.g., at the measurement station, or the lithographic cell LC. An optical axis, which has several branches throughout the apparatus, is represented by a dotted line O. In this apparatus, light emitted by source 11 (e.g., a xenon lamp) is directed onto substrate W via a beam splitter 15 by an optical system comprising polarization selector 10, lenses 12, 14 and objective lens 16. In this embodiment, the polarization selector 10 is controlled by the processing unit PU to select either TM (transverse magnetic) or TE (transverse electric) polarized light for illumination of the substrate W. These lenses are arranged in a double sequence of a 4F arrangement. A different lens arrangement can be used, provided that it still provides a substrate image onto a detector, and simultaneously allows for access of an intermediate pupil-plane for spatial-frequency filtering. Therefore, the angular range at which the radiation is incident on the substrate can be selected by defining a spatial intensity distribution in a plane that presents the spatial spectrum of the substrate plane, here referred to as a (conjugate) pupil plane. In particular, this can be done by inserting an aperture plate 13 of suitable form between lenses 12 and 14, in a plane which is a back-projected image of the objective lens pupil plane. In the example illustrated, aperture plate 13 has different forms, labeled 13N and 13S, allowing different illumination modes to be selected. The illumination system in the present examples forms an off-axis illumination mode. In the first illumination mode, aperture plate 13N provides off-axis from a direction designated, for the sake of description only, as 'north'. In a second illumination mode, aperture plate 13S is used to provide similar illumination, but from an opposite direction, labeled 'south'. Other modes of illumination are possible by using different apertures. The rest of the pupil plane is desirably dark as any unnecessary light outside the desired illumination mode will interfere with the desired measurement signals.

As shown in FIG. 3(b), target grating T is placed with substrate W normal to the optical axis O of objective lens 16. A ray of illumination I impinging on grating T from an angle off the axis O gives rise to a zeroth order ray (solid line 0) and two first order rays (dot-chain line +1 and double dot-chain line −1). It should be remembered that with an overfilled small target grating, these rays are just one of many parallel rays covering the area of the substrate including metrology target grating T and other features. Since the aperture in plate 13 has a finite width (to admit a useful quantity of light), the incident rays I will in fact occupy a range of angles, and the diffracted rays 0 and +1/−1 will be spread out somewhat. According to the point spread function of a small target, each order +1 and −1 will be further spread over a range of angles, not a single ideal ray as shown. Note that the grating pitches and illumination angles can be designed or adjusted so that the first order rays entering the objective lens are closely aligned with the central optical axis. The rays illustrated in FIGS. 3(a) and 3(b) are shown somewhat off axis, purely to enable them to be more easily distinguished in the diagram.

At least the 0 and +1 orders diffracted by the target on substrate W are collected by objective lens 16 and directed back through beam splitter 15. Returning to FIG. 3(a), both the first and second illumination modes are illustrated, by designating diametrically opposite apertures labeled as north (N) and south (S). When the incident ray I is from the north side of the optical axis, that is when the first illumination mode is applied using aperture plate 13N, the +1 diffracted rays, which are labeled +1(N), enter the objective lens 16. In contrast, when the second illumination mode is applied using aperture plate 13S, the −1 diffracted rays (labeled −1(S)) are the ones which enter the lens 16.

A second beam splitter 17 divides the diffracted beams into two measurement branches. In a first measurement branch, optical system 18 forms a diffraction spectrum (pupil plane image) of the target on first sensor 19 (e.g. a CCD or CMOS sensor) using the zeroth and first order diffractive beams. Each diffraction order hits a different point on the sensor, so that image processing can compare and contrast orders. The pupil plane image captured by sensor 19 can be used for focusing the metrology apparatus and/or normalizing intensity measurements of the first order beam. The pupil plane image can also be used for many measurement purposes such as reconstruction, which are not the subject of the present disclosure.

In the second measurement branch, optical system 20, 22 forms an image of the target on the substrate W on sensor 23 (e.g. a CCD or CMOS sensor). In the second measurement branch, an aperture stop 21 is provided in a plane that is conjugate to the pupil-plane. Aperture stop 21 functions to block the zeroth order diffracted beam so that the image of the target formed on sensor 23 is formed only from the −1 or +1 first order beam. The images captured by sensors 19 and 23 are output to image processor and controller PU, the function of which will depend on the particular type of measurements being performed. Note that the term 'image' is used here in a broad sense. An image of the grating lines as such will not be formed, if only one of the −1 and +1 orders is present.

The particular forms of aperture plate 13 and field stop 21 shown in FIG. 3 are purely examples. In another embodiment of the invention, on-axis illumination of the targets is used and an aperture stop with an off-axis aperture is used to pass substantially only one first order of diffracted light to the sensor. In yet other embodiments, 2nd, 3rd and higher order beams (not shown in FIG. 3) can be used in measurements, instead of or in addition to the first order beams.

In order to make the illumination adaptable to these different types of measurement, the aperture plate 13 may comprise a number of aperture patterns formed around a disc, which rotates to bring a desired pattern into place. Alternatively or in addition, a set of plates 13 may be provided and swapped to achieve the same effect. A programmable illumination device such as a deformable mirror array or transmissive spatial sight modulator can be used also. Moving mirrors or prisms can be used as another way to adjust the illumination mode.

As just explained in relation to aperture plate 13, the selection of diffraction orders for imaging can alternatively be achieved by altering the pupil-stop 21, or by substituting a pupil-stop having a different pattern, or by replacing the fixed field stop with a programmable spatial light modulator. In that case the illumination side of the measurement optical system can remain constant, while it is the imaging side that has first and second modes. In the present disclosure, therefore, there are effectively three types of measurement methods, each with its own advantages and disadvantages, In one method, the illumination mode is changed to measure the different orders. In another method, the imaging mode is changed. In a third method, the illumination and imaging modes remain unchanged, but the target is rotated through 180 degrees. In each case the desired effect is the same, namely to select first and second portions of the non-zero order diffracted radiation which are symmetrically opposite one another in the diffraction spectrum of the target. In principle, the desired selection of orders could be obtained by a combination of changing the illumination modes and the imaging modes simultaneously, but that may bring disadvantages for no advantage, so it will not be discussed further.

While the optical system used for imaging in the present examples has a wide entrance pupil which is restricted by the field stop 21, in other embodiments or applications the entrance pupil size of the imaging system itself may be small enough to restrict to the desired order, and thus serve also as the field stop. Different aperture plates 13E, 13W, 13NW, 13SE are shown in FIGS. 3(c) and (d), which can be used as described further below.

Typically, a target grating will be aligned with its grating lines running either north-south or east-west. That is to say, a grating will be aligned in the X direction or the Y direction of the substrate W. Note that aperture plate 13N or 13S can only be used to measure gratings oriented in one direction (X or Y depending on the set-up). For measurement of an orthogonal grating, rotation of the target through 90° and 270° might be implemented. More conveniently, however, illumination from east or west is provided in the illumination optics, using the aperture plate 13E or 13W, shown in FIG. 3(c). The aperture plates 13N to 13W can be separately formed and interchanged, or they may be a single aperture plate which can be rotated by 90, 180 or 270 degrees. As mentioned already, the off-axis apertures illustrated in FIG. 3(c) may be provided in field stop 21 instead of in illumination aperture plate 13. In that case, the illumination would be on axis.

FIG. 3(d) shows a third pair of aperture plates that can be used to combine the illumination modes of the first and second pairs. Aperture plate 13NW has apertures at north and east, while aperture plate 13SE has apertures at south and west. Provided that cross-talk between these different diffraction signals is not too great, measurements of both X and Y gratings can be performed without changing the illumination mode.

FIG. 4 depicts a composite target formed on a substrate according to known practice. The composite target comprises four gratings 32, 33, 34, 35 positioned closely together so that they will all be within a measurement spot 31 formed by the illumination beam of the metrology apparatus. The four targets thus are all simultaneously illuminated and simultaneously imaged on sensors 19 and 23. In an example dedicated to overlay measurement, gratings 32, 33, 34, 35 are themselves composite gratings formed by overlying gratings that are patterned in different layers of the semi-conductor device formed on substrate W. Gratings 32, 33, 34, 35 may have differently biased overlay offsets in order to facilitate measurement of overlay between the layers in which the different parts of the composite gratings are formed. Gratings 32, 33, 34, 35 may also differ in their orientation, as shown, so as to diffract incoming radiation in X and Y directions. In one example, gratings 32 and 34 are X-direction gratings with biases of the +d, −d, respectively. This means that grating 32 has its overlying components arranged so that if they were both printed exactly at their nominal locations, one of the components would be offset relative to the other by a distance d. Grating 34 has its components arranged so that if perfectly printed there would be an offset of d, but in the opposite direction to the first grating and so on. Gratings 33 and 35 are Y-direction gratings with offsets +d and −d respectively. While four gratings are illustrated, another embodiment may include a larger matrix to obtain the desired accuracy. For example, a 3×3 array of nine composite gratings may have biases −4d, −3d, −2d, −d, 0, +d, +2d, +3d, +4d. Separate images of these gratings can be identified in the image captured by sensor 23.

FIG. 5 shows an example of an image that may be formed on and detected by the sensor 23, using the target of FIG. 4 in the apparatus of FIG. 3, using the aperture plates 13NW or 13SE from FIG. 3(d). While the pupil plane image sensor 19 cannot resolve the different individual gratings 32, 33, 34, 35, the image sensor 23 can do so. The dark rectangle represents the field of the image on the sensor, within which the illuminated spot 31 on the substrate is imaged into a corresponding circular area 41. Within this, rectangular areas 42, 43, 44, 45 represent the images of the small target gratings 32, 33, 34, 35. If the gratings are located in product areas, product features may also be visible in the periphery of this image field. Image processor and controller PU processes these images using pattern recognition to identify the separate images 42, 43, 44, 45 of gratings 32, 33, 34, 35. In this way, the images do not have to be aligned very precisely at a specific location within the sensor frame, which greatly improves throughput of the measuring apparatus as a whole. However the desire for accurate alignment remains if the imaging process is subject to non-uniformities across the image field. In one embodiment of the invention, four positions P1, P2, P3, P4 are identified and the gratings are aligned as much as possible with these known positions.

After the separate images of the gratings have been identified, the intensities of those individual images can be measured, e.g., by averaging or summing selected pixel intensity values within the identified areas. Intensities and/or other properties of the images can be compared with one another. These results can be combined to measure different parameters of the lithographic process. Overlay performance is an important example of such a parameter.

Figure 6:
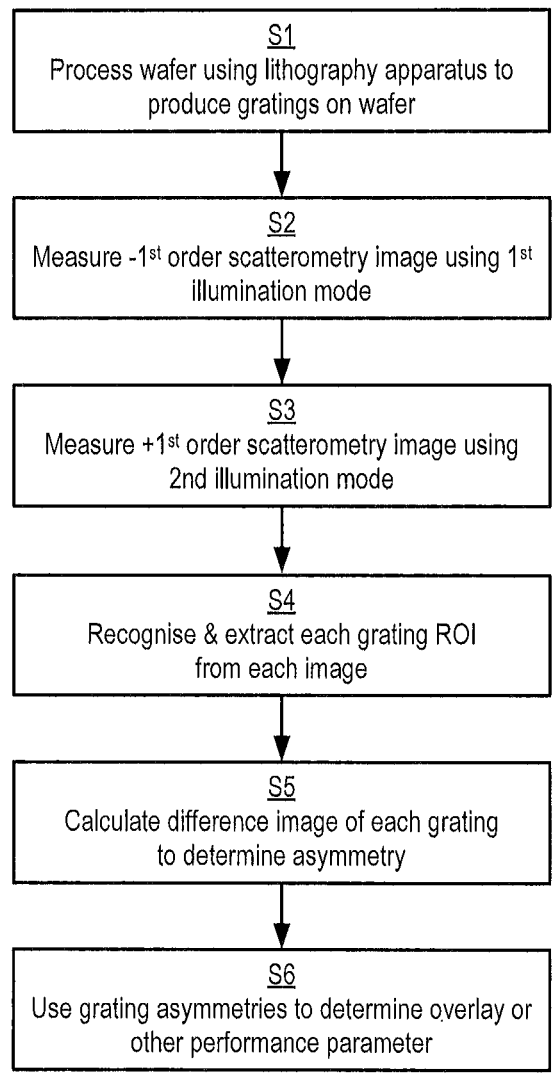
FIG. 6 is a flowchart showing the steps of an overlay measurement method using the scatterometer of FIG. 3 and adaptable to form an embodiment of the present invention.

FIG. 6 illustrates how, using for example the method described in U.S. Patent Application Publication No. 2011/0027704A, overlay error between the two layers containing the component gratings 32, 33, 34, 35 is measured through asymmetry of the gratings, as revealed by comparing their intensities in the +1 order and −1 order dark field images. At step S1, the substrate, for example a semiconductor wafer, is processed through the lithographic cell of FIG. 2 one or more times, to create a structure including the overlay targets 32, 33, 34, 35. At S2, using the metrology apparatus of FIG. 3, an image of the gratings 32, 33, 34, 35 is obtained using only one of the first order diffracted beams (say −1). Then, whether by changing the illumination mode, or changing the imaging mode, or by rotating substrate W by 180° in the field of view of the metrology apparatus, a second image of the gratings using the other first order diffracted beam (+1) can be obtained (step S3). Consequently the +1 diffracted radiation is captured in the second image.

Note that, by including only half of the first order diffracted radiation in each image, the 'images' referred to here are not conventional dark field microscopy images. The individual grating lines will not be resolved. Each grating will be represented simply by an area of a certain intensity level. In step S4, a region of interest (ROI) is carefully identified within the image of each component grating, from which intensity levels will be measured. This is done because, particularly around the edges of the individual grating images, intensity values can be highly dependent on process variables such as resist thickness, composition, line shape, as well as edge effects generally.

Having identified the ROI for each individual grating and measured its intensity, the asymmetry of the grating structure, and hence overlay error, can then be determined. This is done by the image processor and controller PU in step S5 comparing the intensity values obtained for +1 and −1 orders for each grating 32-35 to identify any difference in their intensity, and (S6) from knowledge of the overlay biases of the gratings to determine overlay error in the vicinity of the target T.

While the target structures described above are metrology targets specifically designed and formed for the purposes of measurement, in other embodiments, properties may be measured on targets which are functional parts of devices formed on the substrate. Many devices have regular, grating-like structures. The terms 'target grating' and 'target structure' as used herein do not require that the structure has been provided specifically for the measurement being performed.

In association with the physical grating structures of the targets as realized on substrates and patterning devices, an embodiment may include a computer program containing one or more sequences of machine-readable instructions describing a methods of producing targets on a substrate, measuring targets on a substrate and/or analyzing measurements to obtain information about a lithographic process. This computer program may be executed for example within unit PU in the apparatus of FIG. 3 and/or the control unit LACU of FIG. 2. There may also be provided a data storage medium (e.g., semiconductor memory, magnetic or optical disk) having such a computer program stored therein. Where an existing metrology apparatus, for example of the type shown in FIG. 3, is already in production and/or in use, embodiments of the invention can be implemented by the provision of updated computer program products for causing a processor to perform the modified step S6 and so calculate overlay error with reduced sensitivity to feature asymmetry. The program may optionally be arranged to control the optical system, substrate support and the like to perform the steps S2-S5 for measurement of asymmetry on a suitable plurality of target structures.

Figure 7A:
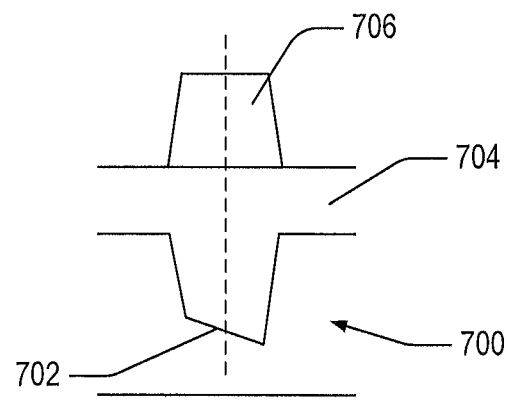
FIGS. 7a and 7b depict a model structure of one period of an overlay target grating with two types of process-induced asymmetry.
Figure 7B:
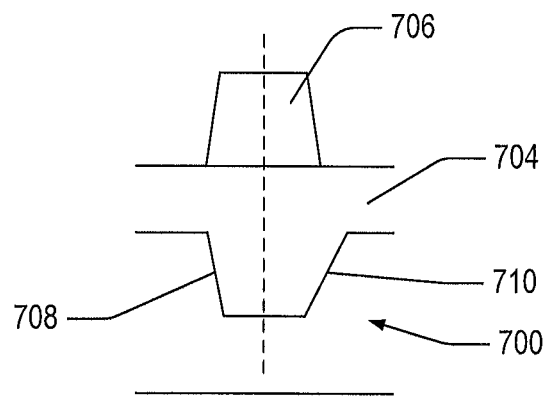

FIGS. 7a and 7b show a model structure of one period of an overlay target grating with two types of process-induced asymmetry. With reference to FIG. 7a, the substrate W is patterned with a bottom grating 700, etched into a substrate layer. The etch process used for the bottom grating results in a tilt of the floor 702 of the etched trench. This floor tilt, FT, can be represented as a structural parameter, for example as a measure of the height drop across the floor 702, in nm. A BARC (bottom anti-reflective coating) layer 704 supports the patterned resist feature of the top grating 706. In this example, the alignment overlay error between the top and bottom grating is zero, as the centers of the top and bottom grating features are at the same lateral position. However, the bottom-layer process-induced asymmetry, i.e. the floor tilt, leads to an error in the measured overlay offset, in this case giving a non-zero overlay offset.

FIG. 7b shows another type of bottom-layer process-induced asymmetry that can lead to a error in the measured overlay offset. This is side wall angle (SWA) unbalance, SWAun. Features in common with those of FIG. 7a are labelled the same. Here, one side wall 708 of the bottom grating has a different slope to the other side wall 710. This unbalance can be represented as a structural parameter, for example as a ratio of the two side wall angles relative to the plane of the substrate.

FIGS. 7a and 7b show a grating overlay target. However, embodiments of the present invention may be used with other targets, such as box-in-box image based overlay targets.

Both asymmetry parameters floor tilt and SWA unbalance give rise to an "apparent" overlay error between the top and bottom gratings. This apparent overlay error comes on top of the "real" overlay error to be measured between the top and bottom gratings. In order to cancel the real overlay between top and bottom grating overlay data obtained with two illumination conditions may be subtracted. The two illumination conditions may be for instance two illumination polarizations, two illumination wavelengths or two illumination modes. Different illumination modes may be implemented with different shaped illumination apertures 13 in FIG. 3a. In the embodiments described herein, an annular illumination aperture is used for pupil-plane detection scatterometry. Another example illumination mode is described with a quadrant illumination profile of the aperture in U.S. Patent Application Publication No. 2010/0201963A1, which document is hereby incorporated by reference in its entirety.

Figure 8:
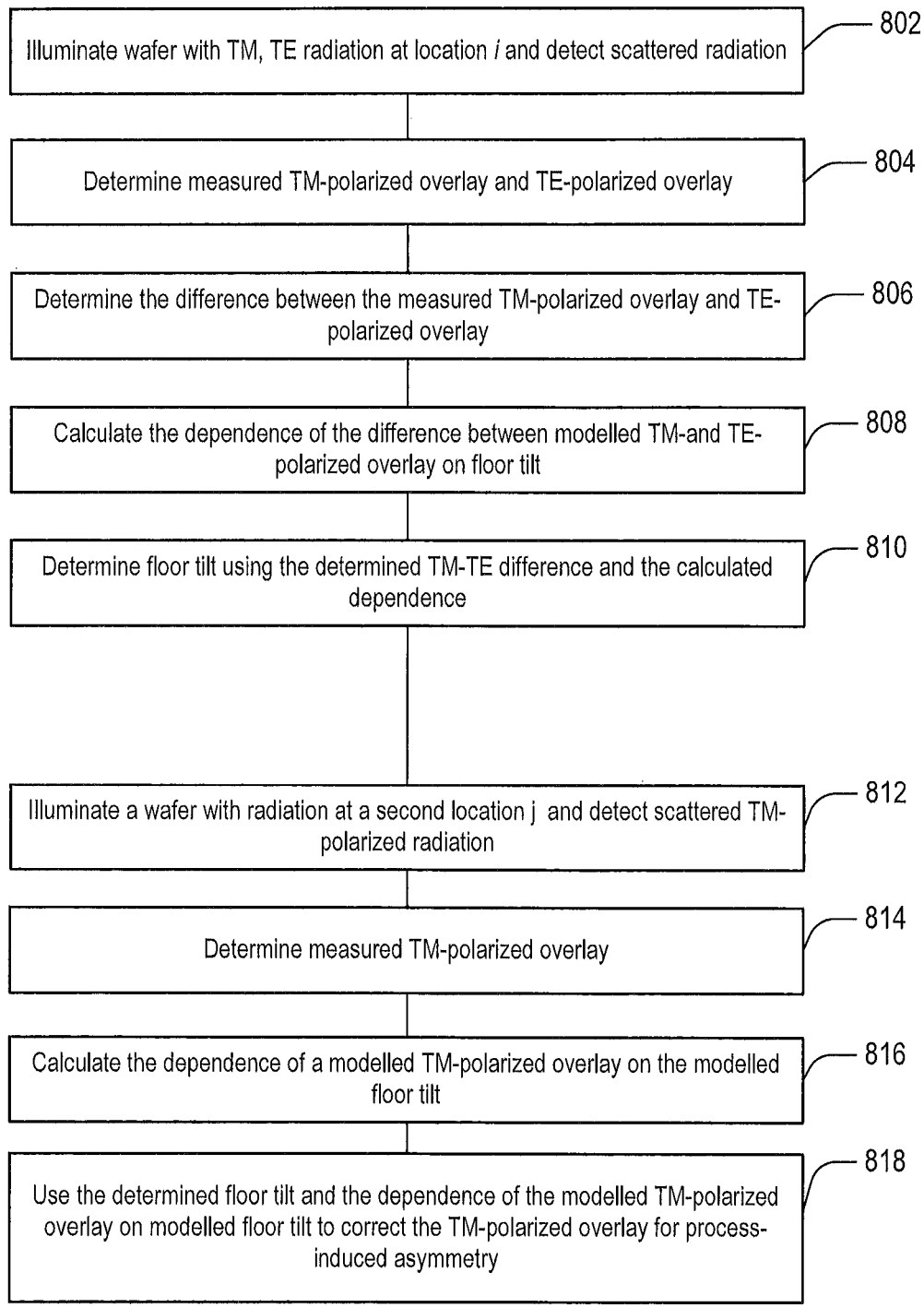
FIG. 8 is a flowchart of a method of determining structural parameters related to process-induced asymmetry and correcting an asymmetry property of a substrate for process-induced asymmetry according to embodiments of the present invention.

FIG. 8 is a flowchart of a method of determining structural parameters related to process-induced asymmetry (steps 802-810) and correcting an asymmetry property of a substrate for process-induced asymmetry (steps 802-818) according to embodiments of the present invention in which overlay data from two polarizations is subtracted. The steps of the methods are:

At 802: Illuminate a structure, having an asymmetry property and comprising a sub-structure susceptible to process-induced asymmetry, here an overlay target on a wafer substrate, with radiation with a plurality of polarizations, at a first location i on the substrate. The illumination may be performed at one or more illumination frequencies $\lambda$. In this embodiment, the plurality of polarizations are TM and TE. Alternatively, illumination conditions other than polarizations may be used, for example wavelengths or scatterometer illumination modes.

In other embodiments, other polarizations may be used, if at least one of the polarizations is found to be useful for asymmetry measurements (such as overlay) and if the polarizations show a difference in measured asymmetry (such as overlay) between each of the polarizations.

This step includes detecting radiation scattered from the structure, arising from the illumination.

This step may include selecting each of the plurality of polarizations (here, TM and TE), for example using the polarization selector 10 shown in FIG. 3a.

Alternatively, the polarization may be selected with a polarization selector placed downstream in the optical path of the target, for example in front of, or as part of the detector.

At 804: Determine measured asymmetry properties for each selected polarization at the first location, i. In this embodiment, the measured asymmetry properties are the overlay offsets $OVm_i|_\lambda^{TM}$ and $OVm_i|_\lambda^{TE}$ respectively. Alternatively, other measured asymmetry properties may be measured, such as ±1$^{st}$ order intensity difference in an angularly resolved pupil plane diffraction pattern.

At 806: Determine a difference, $\Delta OVm_i|_\lambda^{TM-TE}$, between the measured asymmetry properties of the structure obtained with each of the plurality of polarizations, in this embodiment, TM and TE. The difference may be for example an arithmetic difference obtained by subtraction or for example a ratio difference obtained by division.

Figure 9:
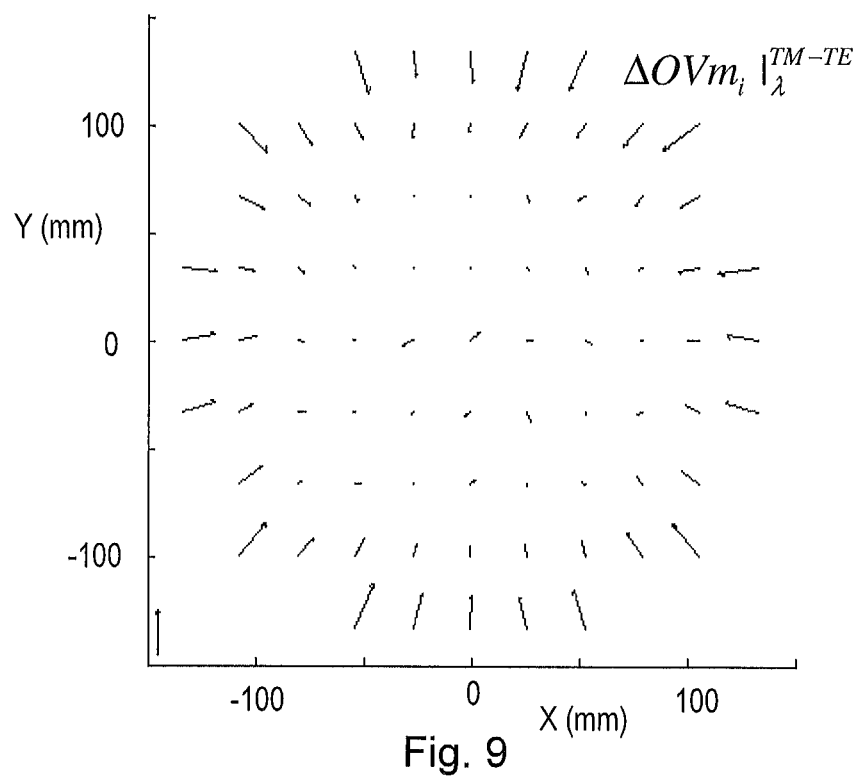
FIG. 9 is a radial overlay plot of the determined difference between overlay obtained with each of TM and TE polarizations.

FIG. 9 shows a radial overlay plot of the determined difference between overlay obtained with each of TM and TE polarizations, $\Delta OVm_i|_\lambda^{TM-TE}$, for an illumination wavelength of 425nm. The overlay was measured using ±1$^{st}$ order intensity difference in an angularly resolved pupil plane diffraction pattern (e.g. on sensor 19 in FIG. 3a). The vectors in FIG. 9 show the magnitude and direction of the overlay error in X and Y across a wafer. In an alternative embodiment, the overlay may be obtained with each of TM and TE polarizations using a scatterometer such as that of FIG. 3a in a dark field mode of operation (i.e. using sensor 23).

Figure 10:
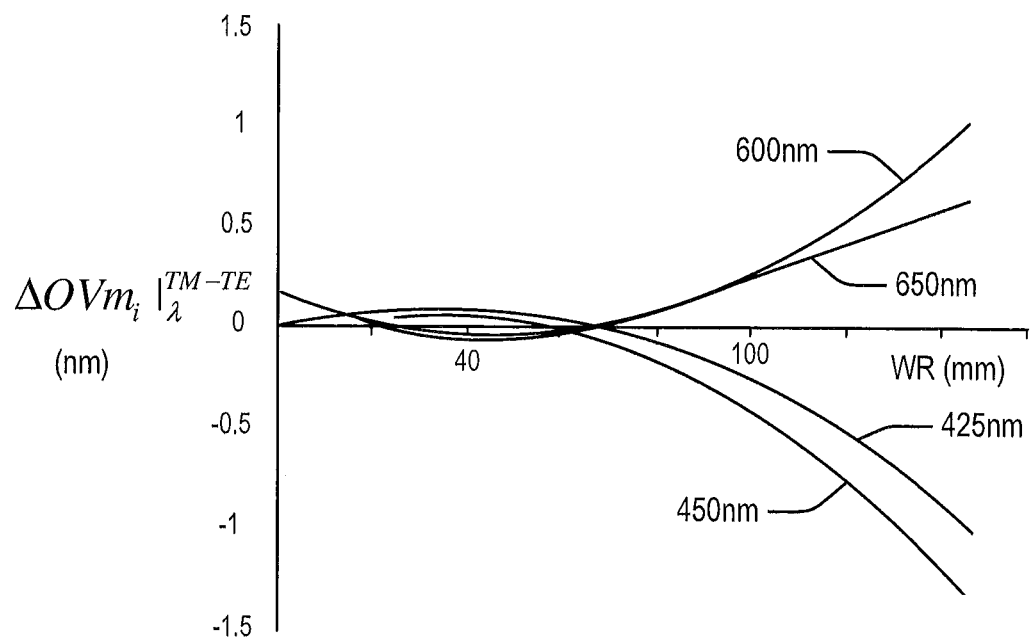
FIG. 10 is a plot of the determined difference between overlay obtained with each of TM and TE polarizations versus wafer radius in mm, for four illumination wavelengths.

FIG. 10 shows a plot of the determined difference, $\Delta OVm_i|_\lambda^{TM-TE}$, versus wafer radius in mm for illumination wavelengths of 425, 450, 600 and 650 nm. It is apparent that the behavior of the determined difference, $\Delta OVm_i|_\lambda^{TM-TE}$, is strongly dependent on the illumination wavelength.

Returning to FIG. 8, the steps continue:

At 808: Calculate a differential dependence, $$\frac{\delta OV}{\delta FT}\Big|_\lambda^{TM-TE},$$

of a difference between modeled asymmetry properties, simulated for illumination by each of the plurality of polarizations, here TM and TE, on a structural parameter representing process-induced asymmetry of the sub-structure. In this embodiment, the modeled asymmetry property is overlay offset, OV, and the structural parameter is floor tilt, FT, in the bottom grating of an overlay target, thus the estimated differential dependence is $$\frac{\delta OV}{\delta FT}\Big|_\lambda^{TM-TE}.$$

With knowledge of the materials and approximate dimensions of the overlay target, this estimated differential dependence on floor tilt can be calculated in advance for every illumination wavelength and every polarization. Suitable calculation methods include using a computational method such as RCWA (Rigorously-Coupled Wave Analysis).

Table 1, in the right-hand column shows the calculated differential dependence for four illumination frequencies in each row.

TABLE 1

| | Calculated differential dependence | | |
|---|---|---|---|
| Illumination wavelength (nm) | Dependence of single-polarization (TM) overlay on floor tilt, $\frac{\partial OV}{\partial FT}\Big|_\lambda^{TM}$ (nm/nm) | Dependence of single-polarization (TE) overlay on floor tilt, $\frac{\partial OV}{\partial FT}\Big|_\lambda^{TE}$ (nm/nm) | Differential dependence, $\frac{\partial OV}{\partial FT}\Big|_\lambda^{TM-TE}$ (nm/nm) |
| 425 | 1.4462 | 0.45484 | 0.991 |
| 450 | 1.4888 | 0.47813 | 1.017 |
| 600 | −3.3224 | −1.4713 | −1.851 |
| 650 | −2.3254 | −1.0513 | −1.274 |

Floor tilt may be measured in nm height change, as illustrated in FIG. 7a. Other structural parameters representing process-induced asymmetry of the sub-structure may be used instead of or in addition to floor tilt, either alone or in combination. Another such structural parameter for a bottom grating sub-structure is side wall angle (SWA) unbalance SWAun, as also illustrated in FIG. 7b.

At 810: Determine a value of the structural parameter at the first location on the wafer, i, using the determined difference, $\Delta OVm_i|_\lambda^{TM-TE}$, and the calculated differential dependence, $$\frac{\delta OV}{\delta FT}\Big|_\lambda^{TM-TE}.$$

In this embodiment, the structural parameter is bottom-layer floor tilt FT and its value $FT_i$ is determined using a least squares procedure, to minimize an error and fit the floor tilt FT to the measured data, for four illumination wavelengths from 425 to 650 nm:

$$(\text{error})_i = \sum_{\lambda=425,450,600,650}^{4} \left(\Delta OVm_i\Big|_\lambda^{TM-TE} - \frac{\delta OV}{\delta FT}\Big|_\lambda^{TM-TE} * FT_i\right)^2. \quad (1)$$

Figure 11:
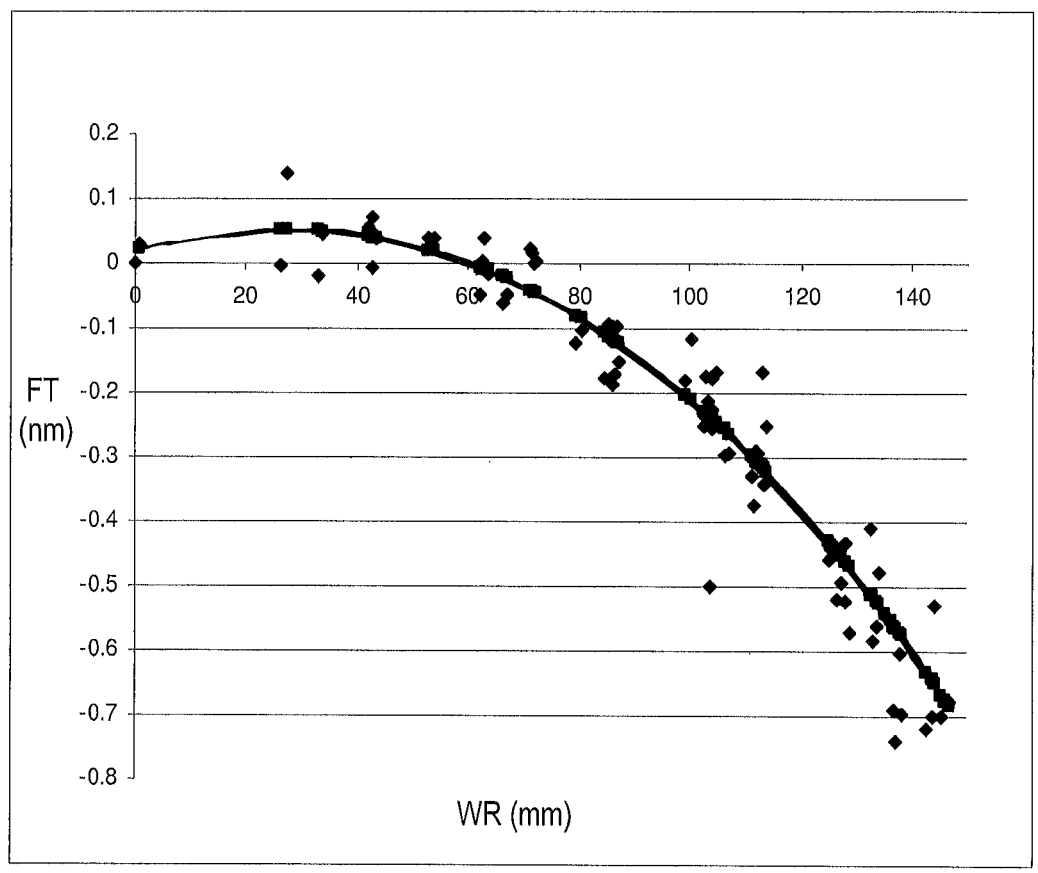
FIG. 11 is a graph of determined values of bottom grating floor tilt, FT, as a function of radius of the wafer.

FIG. 11 is a graph of the determined values of floor tilt, FT, in nm, as a function of radius of the wafer, WR, in mm. It is apparent that up to a radius of about 80 mm the etch reactor used to etch the bottom grating trenches creates symmetrical trenches, but beyond that radius causes process-induced asymmetry which increases to 0.7 nm at the wafer edges. This is an example of the process-induced asymmetry that leads to errors in measured overlay.

In an example case when enough data is available from 5 or 6 wavelengths, it is possible to obtain not only floor tilt, FT, but also side wall angle unbalance, SWAun, which can be found using:

$$(\text{error})_i = \sum_{\lambda=425,450,550,600,650,700}^{6} \left(\Delta OVm_i\Big|_\lambda^{TM-TE} - \frac{\delta OV}{\delta FT}\Big|_\lambda^{TM-TE} * FT_i - \frac{\delta OV}{\delta SWAun}\Big|_\lambda^{TM-TE} * SWAun_i\right)^2 \quad (2)$$

The obtained structural parameter (floor tilt) per wafer position obtained from this least squares method can be used to directly correct measured overlay data. In the following, TM–TE overlay is first corrected to verify the effectiveness of the correction, then correction of TM overlay is described.

In order to verify the effect of the correction, using the determined value of the structural parameter $FT_i$, the measured overlay TM–TE difference can be corrected to give the corrected overlay offset $\Delta OVcorr$ as follows:

$$OVcorr|_{\lambda,i}^{TM-TE} = \Delta OVm_i|_{\lambda}^{TM-TE} - \frac{\delta OV}{\delta FT}\Big|_{\lambda}^{TM-TE} * FT_i \quad (3)$$

Figure 12:
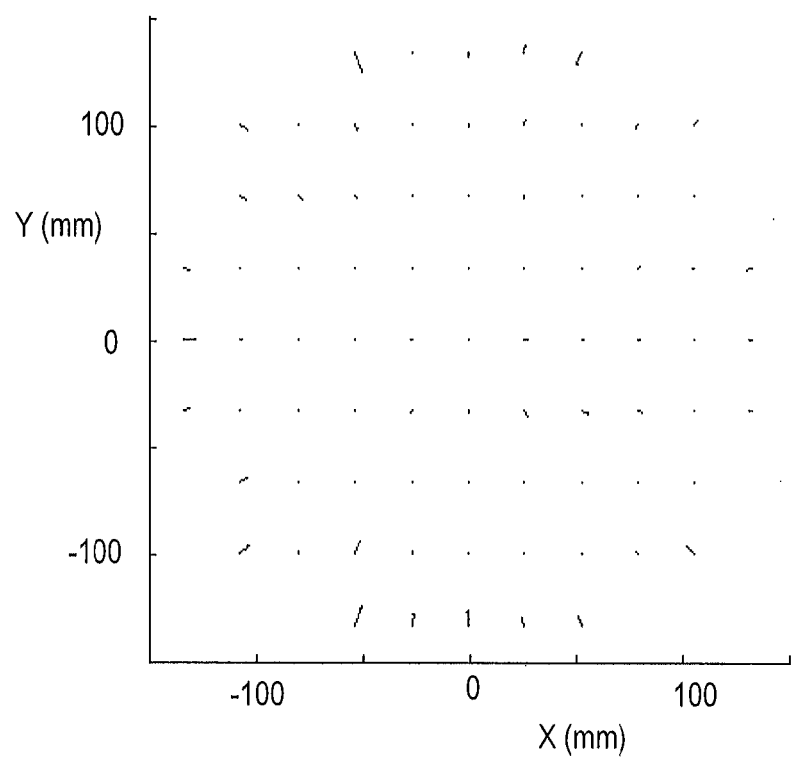
FIG. 12 is a radial overlay plot of the difference between overlay obtained with TM and TE polarizations, corrected using the floor tilt parameter, FT.

FIG. 12 is a radial overlay plot of the corrected difference, $OVcorr|^{TM-TE}_{\lambda,i}$, between overlay obtained with each of TM and TE polarizations, corrected using the floor tilt parameter, FT. When compared to FIG. 9, it is apparent that the effect of process-induced errors are reduced.

Figure 13:
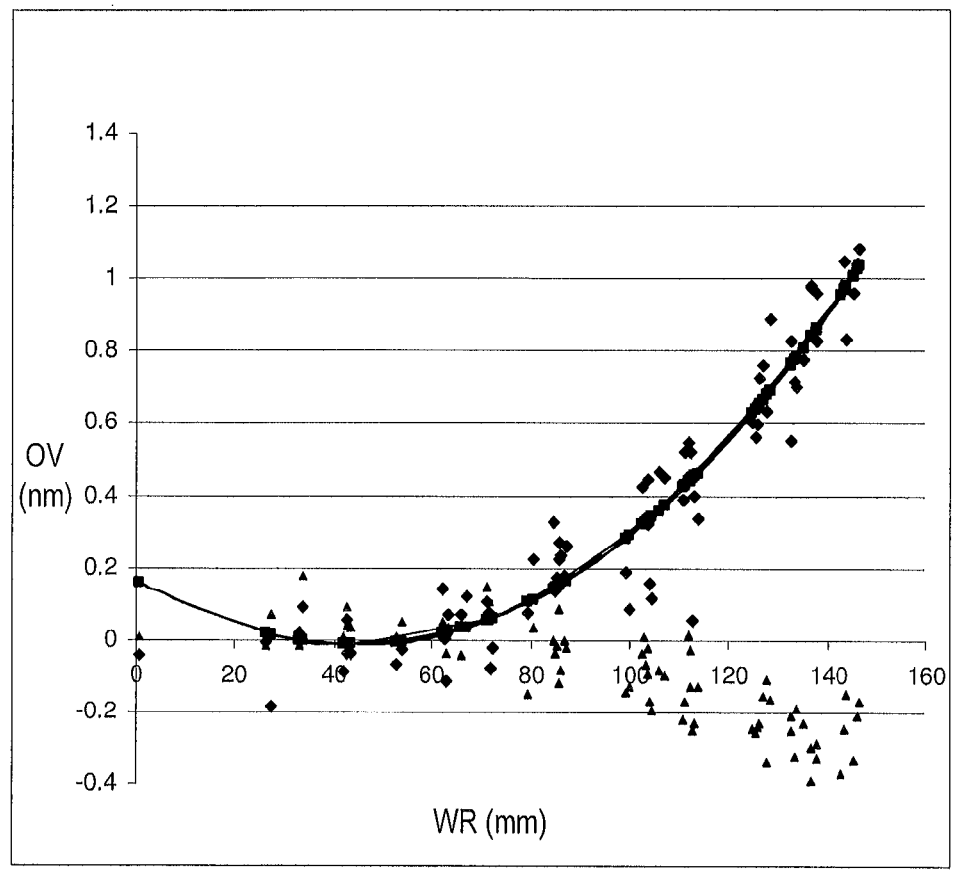
FIG. 13 is a plot of the difference between overlay obtained with TM and TE polarizations, both measured (diamonds) and corrected (triangles), versus wafer radius.

FIG. 13 is a plot of the difference between overlay obtained with each of TM and TE polarizations, both as measured, $\Delta OVm_i|_{\lambda}^{TM-TE}$ (diamond symbols), and as corrected, $OVcorr|^{TM-TE}_{\lambda,i}$ (triangle symbols), versus wafer radius, WR, in mm, for an example illumination wavelength of 600 nm. In this example, overlay errors of 1 nm are reduced to around 0.3 nm by applying the correction method of this embodiment. The overlay errors are not in this example fully corrected, i.e. they are not distributed around zero. Second order effects may be caused by other process-induced asymmetries in the bottom or top grating or real overlay offsets between the top and bottom grating alignment.

In another example case when two asymmetry parameters, FT and SWAun are available, the calculation can be:

$$OVcorr|_{\lambda,i}^{TM-TE} = \Delta OVm_i|_{\lambda}^{TM-TE} - \frac{\delta OV}{\delta FT}\Big|_{\lambda}^{TM-TE} * FT_i - \frac{\delta OV}{\delta SWAun}\Big|_{\lambda}^{TM-TE} * SWAun \quad (4)$$

Embodiments of the present invention are not limited to one or two structural parameters. The number of wavelengths used to determine one parameter may be one. For two parameters, two wavelengths may be used, and so on.

Returning to FIG. 8, the steps continue:

At 812: Illuminate a structure, having an asymmetry property and comprising a sub-structure susceptible to process-induced asymmetry, with radiation with at least one of a plurality of polarizations at a second location j on a substrate. In this embodiment, the structure is an overlay target and the sub-structure is the bottom grating of the overlay target. In this embodiment, at least one of TM and TE is used. For FIG. 8, TM only is used. This step may be performed at one or more illumination frequencies, λ. This may be performed on the same substrate used to determine the value of the structural parameter, floor tilt, FT, or a different substrate. If it is the same substrate, this step may be the same step as the previous illumination step that was used to determine the value of the structural parameter, floor tilt, FT. This step may be performed either at the same location that was used to determine the value of the structural parameter, floor tilt, FT, (i.e. the first and second locations are coincident, i=j), or a different location (i.e. i≠j). The radiation is scattered from an overlay target on the substrate.

In this embodiment, this step includes detecting radiation of the selected polarization of the at least one of a plurality of polarizations scattered from the structure. In this embodiment, the selected polarization may be TM or TE. For FIG. 8, TM is selected.

At 814: Determine a single-polarization asymmetry property, using the detected radiation of the selected polarization. In this embodiment, the determined selected-polarization asymmetry property is overlay offset, $\Delta OVm_j|_{\lambda}^{TM}$ or $\Delta OVm_j|_{\lambda}^{TE}$, depending whether TM or TE polarization, respectively, are selected. As mentioned above, alternatively other asymmetry properties may be used, such as $\pm 1^{st}$ order intensity difference determined from a detected angularly resolved pupil plane diffraction pattern.

At 816: Calculate a dependence of a modeled single-polarization asymmetry property, simulated for illumination by the selected polarization, on the structural parameter. The calculation may be performed at one or more illumination frequencies, λ. In this embodiment, the selected polarization may be TM or TE. The modeled asymmetry property is overlay offset, OV, and the structural parameter is floor tilt FT, thus the dependence of the modeled single-polarization asymmetry property is $$\frac{\delta OV}{\delta FT}\Big|_{\lambda}^{TM} \text{ or}$$

$$\frac{\delta OV}{\delta FT}\Big|_{\lambda}^{TE},$$

depending whether TM or TE polarization respectively are selected.

At 818: Use a value of the structural parameter, here $FT_j$, at the second substrate location, j, (which may be derived, for example by interpolation, from the determined value of the structural parameter, here $FT_i$, at the first substrate location, i) and the calculated dependence of the modeled single-polarization asymmetry property to correct the selected-polarization asymmetry property for process-induced asymmetry. This step may be performed at one or more illumination frequencies, λ.

In this embodiment, for example with TM illumination, the single-polarization asymmetry property is overlay offset $\Delta OVm_j|_{\lambda}^{TM}$. Furthermore, the estimated dependence on floor tilt FT of the modeled overlay error OV simulated with the TM polarization is $$\frac{\delta OV}{\delta FT}\Big|_{\lambda}^{TM}.$$

In this embodiment the corrected overlay offset $\Delta OVcorr$ may be calculated as:

$$OVcorr|_{\lambda,j}^{TM} = \Delta OVm_j|_{\lambda}^{TM} - \frac{\delta OV}{\delta FT}\Big|_{\lambda}^{TM} * FT_j. \quad (5)$$

Alternatively, in steps 814 to 818, a single illumination condition other than a single polarization may be used, for example a single wavelength or a single scatterometer illumination mode.

Figure 14A:
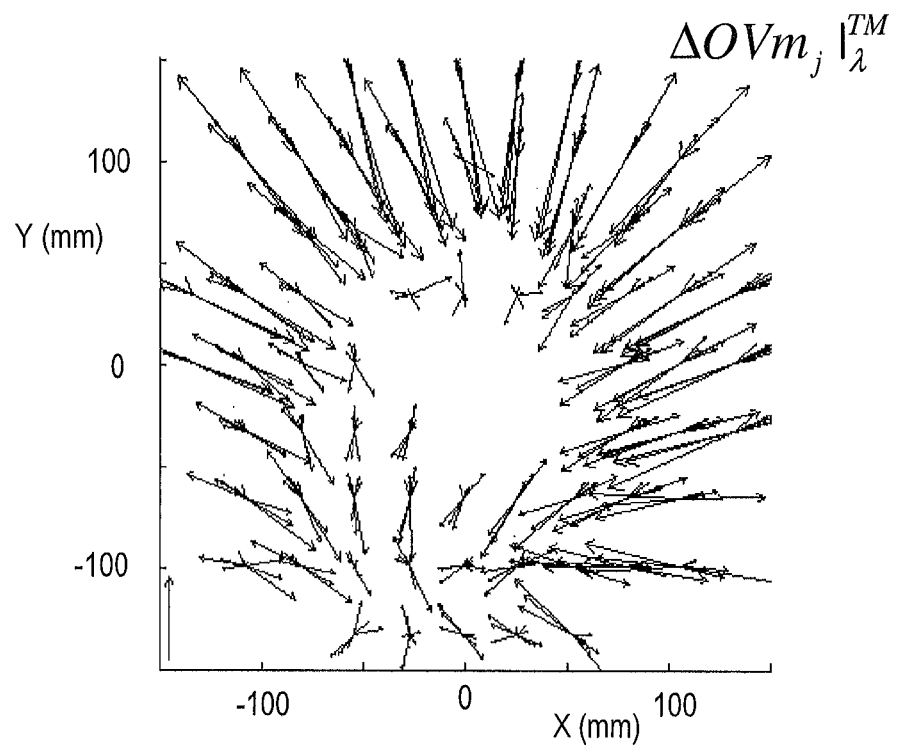
FIGS. 14a and 14b are radial overlay plots that illustrate the effect of the correction on a single-polarization measurement.
Figure 14B:
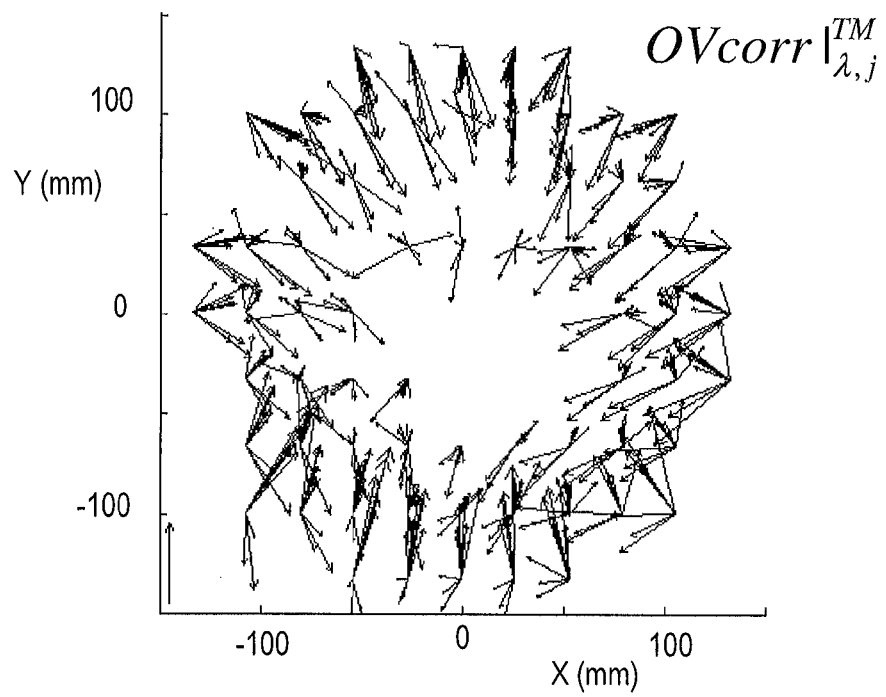

FIGS. 14a and 14b illustrate the effect of the correction on a single-polarization measurement, which is relevant in a production environment where a single polarization and single wavelength are typically used to measure overlay. FIG. 14a is a radial plot of overlay offset measured with TM polarization, $\Delta OVm_j|_\lambda^{TM}$, before the correction is applied. FIG. 14b is a radial plot of the corrected overlay offset, $OVcorr|_{\lambda,j}^{TM}$. FIG. 14a shows raw overlay-vectors at one polarization, TM, and at six different wavelengths all over a wafer. In FIG. 14b the same overlay data is used but now corrected for the bottom grating asymmetry. The maximum vector length that has been corrected is about 1.5 nm in this example.

In practice, methods according to embodiments of the present invention may be implemented with very efficient measurement schemes. For example, 11 points on a wafer, with TE and TM measurements at two wavelengths obtained in a total measurement time of 90 s can allow useful calculation of floor tilt and correction of overlay measurements for process-induced asymmetry.

Further embodiments according to the invention are provided in below numbered clauses:

1. A method of determining a structural parameter related to process-induced asymmetry, the method comprising:
   illuminating a structure, having an asymmetry property and comprising a sub-structure susceptible to process-induced asymmetry, with radiation with a plurality of illumination conditions, at a first location of a substrate;
   determining a difference between measured asymmetry properties of the structure obtained with each of the plurality of illumination conditions;
   calculating a differential dependence of a difference between modeled asymmetry properties simulated for illumination by each of the plurality of illumination conditions on a structural parameter representing process-induced asymmetry of the sub-structure; and
   determining a value of the structural parameter using the determined difference and the calculated differential dependence.

2. The method of clause 1, wherein the measured asymmetry properties are obtained by:
   detecting radiation scattered from the structure, arising from the illumination at the first location;
   selecting each of the plurality of illumination conditions; and
   determining the measured asymmetry properties for each selected illumination condition at the first location.

3. The method of clause 1 or clause 2, wherein the illumination conditions comprise polarizations.

4. The method of clause 1 or clause 2, wherein the illumination conditions comprise wavelengths.

5. The method of clause 1 or clause 2, wherein the illumination conditions comprise scatterometer illumination modes.

6. The method of any previous clause, wherein the structure comprises an overlay target.

7. The method of clause 6, wherein the sub-structure comprises a bottom layer of an overlay target.

8. The method of any previous clause, wherein the asymmetry property is overlay offset.

9. The method of clause 8, wherein the structural parameter is floor tilt.

10. The method of clause 8, wherein the structural parameter is side wall angle unbalance.

11. A method of correcting a measured asymmetry property for process-induced asymmetry, the method comprising determining a structural parameter related to process-induced asymmetry in accordance with the method of any of clauses 1 to 10, and further comprising:
   calculating a dependence of a modeled single-illumination-condition asymmetry property, simulated for illumination by a single illumination condition, on the structural parameter; and
   using the determined structural parameter at the first location on the substrate and the calculated dependence of the modeled single-illumination-condition asymmetry property to correct a measured single-illumination-condition asymmetry property for process-induced asymmetry.

12. The method of clause 11, further comprising, prior to said using the determined structural parameter:
   illuminating a structure, having an asymmetry property and comprising a sub-structure susceptible to process-induced asymmetry, with radiation with at least one of a plurality of illumination conditions at a second location on the substrate;
   detecting radiation of a selected illumination condition of the at least one of a plurality of illumination conditions scattered from the structure; and
   determining the measured single-illumination-condition asymmetry property of the structure, using the detected radiation of the selected illumination condition.

13. The method of clause 12, wherein in said using the determined structural parameter at the first location on the substrate comprises calculating a value of the structural parameter at the second substrate location derived from the determined value of the structural parameter at the first location on the substrate.

14. The method of any of clauses 11 to 13, wherein the single-illumination-condition is single-polarization.

15. The method of any of clauses 11 to 13, wherein the single-illumination-condition is single-wavelength, 16. The method of any of clauses 11 to 13, wherein the single-illumination-condition is single scatterometer illumination mode.

17. An inspection apparatus for determining a structural parameter related to process-induced asymmetry, the inspection apparatus comprising:
   an illumination system configured to illuminate a structure, the structure having an asymmetry property and comprising a sub-structure susceptible to process-induced asymmetry, with radiation with a plurality of illumination conditions, at a first location of a substrate; and
   a processor configured to:
      determine a difference between measured asymmetry properties of the structure obtained with each of the plurality of illumination conditions;
      calculate a differential dependence of a difference between modeled asymmetry properties simulated for illumination by each of the plurality of illumination conditions on a structural parameter representing process-induced asymmetry of the sub-structure; and
      determine a value of the structural parameter using the determined difference and the calculated differential dependence.

18. The inspection apparatus of clause 17, wherein the inspection apparatus further comprises a detection system configured to detect radiation scattered from the structure, arising from the illumination at the first location, wherein the illumination system is configured to select each of the plurality of illumination conditions, and wherein the processor is configured to determine the measured asymmetry properties for each selected illumination condition at the first location.

19. The inspection apparatus clause 17 or clause 18, wherein the illumination conditions comprise polarizations.

20. The inspection apparatus clause 17 or clause 18, wherein the illumination conditions comprise wavelengths.

21. The inspection apparatus clause 17 or clause 18, wherein the illumination conditions comprise scatterometer illumination modes.

22. The inspection apparatus of any of clauses 17 to 21, wherein the structure comprises an overlay target.

23. The inspection apparatus of clause 22, wherein the sub-structure comprises a bottom layer of an overlay target.

24. The inspection apparatus of any of clauses 17 to 23, wherein the asymmetry property is overlay offset.

25. The inspection apparatus of clause 24, wherein the structural parameter is floor tilt.

26. The inspection apparatus of clause 24, wherein the structural parameter is side wall angle unbalance.

27. An inspection apparatus for correcting a measured asymmetry property for process-induced asymmetry, the inspection apparatus in accordance with the inspection apparatus of any of clauses 17 to 26, wherein the processor is further configured to:
calculate a dependence of a modeled single-illumination-condition asymmetry property, simulated for illumination by a single illumination condition, on the structural parameter; and
use the determined structural parameter at the first location on the substrate and the calculated dependence of the modeled single-illumination-condition asymmetry property to correct a measured single-illumination-condition asymmetry property for process-induced asymmetry.

28. The inspection apparatus of clause 27, when dependent on clause 18, wherein:
the illumination system is configured to illuminate a structure, having an asymmetry property and comprising a sub-structure susceptible to process-induced asymmetry, with radiation with at least one of a plurality of illumination conditions at a second location on the substrate;
the detection system is configured to detect radiation of a selected illumination condition of the at least one of a plurality of illumination conditions scattered from the structure; and
the processor is configured to determine the measured single-illumination-condition asymmetry property of the structure, using the detected radiation of the selected illumination condition.

29. The inspection apparatus of clause 28, wherein in the processor is configured to use the determined structural parameter at the first location on the substrate by calculating a value of the structural parameter at the second substrate location derived from the determined value of the structural parameter at the first location on the substrate.

30. The inspection apparatus of any of clauses 27 to 29, wherein the single-illumination-condition is single-polarization.

31. The inspection apparatus of any of clauses 27 to 29, wherein the single-illumination-condition is single-wavelength.

32. The inspection apparatus of any of clauses 27 to 29, wherein the single-illumination-condition is single scatterometer illumination mode.

33. A lithographic apparatus comprising:
an illumination system arranged to illuminate a pattern;
a projection system arranged to project an image of the pattern on to a substrate; and
an inspection apparatus for determining a structural parameter related to process-induced asymmetry, the inspection apparatus comprising:
an illumination system configured to illuminate a structure, having an asymmetry property and comprising a sub-structure susceptible to process-induced asymmetry, with radiation with a plurality of illumination conditions, at a first location of a substrate; and
a processor configured to:
determine a difference between measured asymmetry properties of the structure obtained with each of the plurality of illumination conditions;
calculate a differential dependence of a difference between modeled asymmetry properties simulated for illumination by each of the plurality of illumination conditions on a structural parameter representing process-induced asymmetry of the sub-structure; and
determine a value of the structural parameter using the determined difference and the calculated differential dependence.

34. A lithographic cell comprising:
a coater arranged to coat substrates with a radiation sensitive layer;
a lithographic apparatus arranged to expose images onto the radiation sensitive layer of substrates coated by the coater;
a developer arranged to develop images exposed by the lithographic apparatus; and
an inspection apparatus for determining a structural parameter related to process-induced asymmetry, the inspection apparatus comprising:
an illumination system configured to illuminate a structure, having an asymmetry property and comprising a sub-structure susceptible to process-induced asymmetry, with radiation with a plurality of illumination conditions, at a first location of a substrate; and
a processor configured to:
determine a difference between measured asymmetry properties of the structure obtained with each of the plurality of illumination conditions;
calculate a differential dependence of a difference between modeled asymmetry properties simulated for illumination by each of the plurality of illumination conditions on a structural parameter representing process-induced asymmetry of the sub-structure; and
determine a value of the structural parameter using the determined difference and the calculated differential dependence.

35. A device manufacturing method comprising:
using a lithographic apparatus to form a pattern on a substrate; and
determining an asymmetry property of the pattern by:
illuminating a structure, having an asymmetry property and comprising a sub-structure susceptible to process-induced asymmetry, with radiation with a plurality of illumination conditions, at a first location of a substrate;
determining a difference between measured asymmetry properties of the structure obtained with each of the plurality of illumination conditions;
calculating a differential dependence of a difference between modeled asymmetry properties simulated for illumination by each of the plurality of illumination conditions on a structural parameter representing process-induced asymmetry of the sub-structure;
determining a value of the structural parameter using the determined difference and the calculated differential dependence;
calculating a dependence of a modeled single-illumination-condition asymmetry property, simulated for illumination by a single illumination condition, on the structural parameter; and
using the determined structural parameter at the first location on the substrate and the calculated dependence of the modeled single-illumination-condition asymmetry property to correct a measured single-illumination-condition asymmetry property for process-induced asymmetry.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein, encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description by example, and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

What is claimed is:

1. A method comprising:
    illuminating a structure, having an asymmetry property and comprising a sub-structure susceptible to process-induced asymmetry, with radiation with a plurality of illumination conditions, at a first location of a substrate;
    determining a difference between measured asymmetry properties of the structure obtained with each of the plurality of illumination conditions;
    calculating a differential dependence of a difference between modeled asymmetry properties simulated for illumination by each of the plurality of illumination conditions on a structural parameter representing process-induced asymmetry of the sub-structure; and
    determining a value of the structural parameter using the determined difference and the calculated differential dependence.

2. The method of claim 1, wherein the measured asymmetry properties are obtained by:
    detecting radiation scattered from the structure, arising from the illumination at the first location;
    selecting each of the plurality of illumination conditions; and
    determining the measured asymmetry property for each selected illumination condition at the first location.

3. The method of claim 1, wherein the structure comprises an overlay target.

4. The method of claim 3, wherein the sub-structure comprises a bottom layer of an overlay target.

5. The method of claim 1, wherein the asymmetry property is overlay offset.

6. The method of claim 5, wherein the structural parameter is floor tilt.

7. The method of claim 5, wherein the structural parameter is side wall angle unbalance.

8. The method of claim 1, further comprising:
    calculating a dependence of a modeled single-illumination-condition asymmetry property, simulated for illumination by a single illumination condition, on the structural parameter; and
    using the determined structural parameter at the first location on the substrate and the calculated dependence of the modeled single-illumination-condition asymmetry property to correct a measured single-illumination-condition asymmetry property for process-induced asymmetry.

9. The method of claim 8, further comprising using a lithographic apparatus to form a pattern on the substrate to form the structure.

10. The method of claim 8, further comprising, prior to using the determined structural parameter:
    illuminating a structure, having an asymmetry property and comprising a sub-structure susceptible to process-induced asymmetry, with radiation with at least one of a plurality of illumination conditions at a second location on the substrate;
    detecting radiation of a selected illumination condition of the at least one of a plurality of illumination conditions scattered from the structure; and
    determining the measured single-illumination-condition asymmetry property of the structure, using the detected radiation of the selected illumination condition.

11. The method of claim 10, wherein in using the determined structural parameter at the first location on the substrate comprises calculating a value of the structural parameter at the second substrate location derived from the determined value of the structural parameter at the first location on the substrate.

12. An apparatus comprising:
    an illumination system configured to illuminate a structure, the structure having an asymmetry property and comprising a sub-structure susceptible to process-induced asymmetry, with radiation with a plurality of illumination conditions, at a first location of a substrate; and
    a processor configured to:
        determine a difference between measured asymmetry properties of the structure obtained with each of the plurality of illumination conditions;
        calculate a differential dependence of a difference between modeled asymmetry properties simulated for illumination by each of the plurality of illumination conditions on a structural parameter representing process-induced asymmetry of the sub-structure; and
        determine a value of the structural parameter using the determined difference and the calculated differential dependence.

13. The apparatus of claim 12, further comprising a detection system configured to detect radiation scattered from the structure, arising from the illumination at the first location, wherein the illumination system is configured to select each of the plurality of illumination conditions, and wherein the processor is configured to determine the measured asymmetry property for each selected illumination condition at the first location.

14. The apparatus of claim 12, wherein the structure comprises an overlay target.

15. The apparatus of claim 14, wherein the sub-structure comprises a bottom layer of an overlay target.

16. The apparatus of claim 12, wherein the asymmetry property is overlay offset.

17. The apparatus of claim 16, wherein the structural parameter is floor tilt.

18. The apparatus of claim 16, wherein the structural parameter is side wall angle unbalance.

19. The apparatus of claim 12, wherein the processor is further configured to:
   calculate a dependence of a modeled single-illumination-condition asymmetry property, simulated for illumination by a single illumination condition, on the structural parameter; and
   use the determined structural parameter at the first location on the substrate and the calculated dependence of the modeled single-illumination-condition asymmetry property to correct a measured single-illumination-condition asymmetry property for process-induced asymmetry.

20. The apparatus of claim 19, further comprising a detection system configured to detect radiation scattered from the structure, arising from the illumination at the first location, wherein the illumination system is configured to select each of the plurality of illumination conditions, and wherein the processor is configured to determine the measured asymmetry property for each selected illumination condition at the first location and wherein:
   the illumination system is configured to illuminate a structure, having an asymmetry property and comprising a sub-structure susceptible to process-induced asymmetry, with radiation with at least one of a plurality of illumination conditions at a second location on the substrate;
   the detection system is configured to detect radiation of a selected illumination condition of the at least one of a plurality of illumination conditions scattered from the structure; and
   the processor is configured to determine the measured single-illumination-condition asymmetry property of the structure, using the detected radiation of the selected illumination condition.

21. The apparatus of claim 20, wherein the processor is further configured to use the determined structural parameter at the first location on the substrate by calculating a value of the structural parameter at the second substrate location derived from the determined value of the structural parameter at the first location on the substrate.

22. The apparatus of claim 12, further comprising:
   a coater arranged to coat a substrate with a radiation sensitive layer;
   a lithographic apparatus arranged to expose an image onto a radiation sensitive layer of the substrate coated by the coater; and
   a developer arranged to develop an image exposed by the lithographic apparatus.

23. A lithographic apparatus comprising:
   a projection system arranged to project a pattern image on to a substrate; and
   an inspection apparatus comprising:
      an illumination system configured to illuminate a structure, having an asymmetry property and comprising a sub-structure susceptible to process-induced asymmetry, with radiation with a plurality of illumination conditions, at a first location of a substrate; and
      a processor configured to:
         determine a difference between measured asymmetry properties of the structure obtained with each of the plurality of illumination conditions;
         calculate a differential dependence of a difference between modeled asymmetry properties simulated for illumination by each of the plurality of illumination conditions on a structural parameter representing process-induced asymmetry of the sub-structure; and
         determine a value of the structural parameter using the determined difference and the calculated differential dependence.

* * * * *